US006212667B1

(12) United States Patent
Geer et al.

(10) Patent No.: US 6,212,667 B1
(45) Date of Patent: Apr. 3, 2001

(54) INTEGRATED CIRCUIT TEST COVERAGE EVALUATION AND ADJUSTMENT MECHANISM AND METHOD

(75) Inventors: Charles Porter Geer, Rochester; Ronald Nick Kalla, Zumbro Falls; Jerome Martin Meyer, Chaska, all of MN (US); Shmuel Ur, Misgav (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/126,142

(22) Filed: Jul. 30, 1998

(51) Int. Cl.[7] ....................................... G06F 17/50
(52) U.S. Cl. ................... 716/6; 716/5; 714/35; 714/38; 714/738; 714/739; 714/741
(58) Field of Search .................. 703/14; 716/6, 716/5; 714/6, 35, 739, 724, 738, 38, 741

(56) References Cited

U.S. PATENT DOCUMENTS

| | | | |
|---|---|---|---|
| 4,204,633 | * | 5/1980 | Goel ..................................... 714/738 |
| 4,862,399 | * | 8/1989 | Freeman ............................... 714/738 |
| 5,546,320 | * | 8/1996 | Biro et al. ............................. 716/6 |
| 5,550,841 | * | 8/1996 | O'Brien ................................ 714/724 |
| 5,583,787 | * | 12/1996 | Underwood et al. ................... 716/6 |
| 5,596,587 | * | 1/1997 | Douglas et al. ....................... 714/739 |
| 5,633,813 | * | 5/1997 | Srinivasan ............................. 703/14 |
| 5,659,555 | * | 8/1997 | Lee et al. .............................. 714/738 |
| 5,692,122 | * | 11/1997 | Bird ....................................... 714/38 |
| 5,726,996 | * | 3/1998 | Chakradhar et al. ................ 714/724 |
| 5,758,061 | * | 5/1998 | Plum ..................................... 714/35 |
| 5,831,998 | * | 11/1998 | Ozmizrak ............................. 714/741 |
| 6,041,429 | * | 3/2000 | Koenemann ......................... 714/738 |
| 6,063,132 | * | 5/2000 | DeCamp et al. ....................... 716/5 |

OTHER PUBLICATIONS

Aharon et al., "Test Program Generation for Functional Verification of PowerPC Processors in IBM", Proceedings of the 32nd Design Automation Conference 1995, San Francisco CA, Jun. 12–16, 1995, pp. 279–285.

Diep et al., "Systematic Validation of Pipeline Interlock for Superscaler Microarchitectures", Proceedings of the 25th Annual International Symposium on Fault–Tolerance, Jun. 1995.

* cited by examiner

Primary Examiner—Kevin J. Teska
Assistant Examiner—Jibreel Speight
(74) Attorney, Agent, or Firm—Martin & Associates, L.L.C.; Derek P. Martin

(57) ABSTRACT

Testcases are run to test the design of an integrated circuit. The coverage of the testcases is evaluated and compared against one or more microarchitecture models that define the behavior of a portion of the integrated circuit. If the coverage of the testcases is not adequate, new testcases are generated to test the previously untested behavior specified in the microarchitecture models.

26 Claims, 10 Drawing Sheets

```
DefVersion:  1.26          Architecture: Pulsar                    500
####  Global Policies
GlobalVersion:      1.06
DefDescription:
DefDescription:
TestDescription:
TestFilename:          sample.tst
NumberOfTests:         1
RandomSeed:            0
IhFilename:            default.ih
ConfigFilename:        sample.cfg
####  Branch Not Taken
BNT: 1  1.01
####  Thread[default][default]
Thread:           0
ThreadVersion:    1.02        (Architecture: Pulsar)
InitialAddress:
MemoryAllocation: 0  1.02
####  Cache
Cache:          0  1.03
SequencePolicy:  Random
RegisterInits:          0  1.00
CodeRanges:       0  0  1.02
DataRanges:          0  0  1.02
MixedRanges:      0  0  1.02
0     ###
Instruction - type label name has_bias has_field
0 . 1 add 0 0 0 0 0 0
1     ###
Instruction - type label name has_bias has_field
0 . 1 ld 0 0 0 0 0 0
2     ###
Instruction - type label name has_bias has_field
0 . 1 b 0 0 0 0 0 0
3     ###
Instruction - type label name has_bias has_field
0 . 1 cmp 0 0 0 0 0 0
4     ###
Instruction - type label name has_bias has_field
0 . 1 crorc 0 0 0 0 0 0
```

FIG. 5

```
* TestFile: sample.tst                                                              600
* DefFile: sample.def
*******************************************************************************
INITIALIZATIONS: DATA MEMORY
*******************************************************************************
D  00000000000066E0 OEFBF21AD3115102 * NONE EA=FFF00000000066E0
*******************************************************************************
INITIALIZATIONS: REGISTERS
*******************************************************************************
R  IAR   6160000063278048
R  G17   C8135B5DB79E68CE
R  G0    02F123622D80CCC1
R  G11   2CCA40A6A97179E0
R  G18   FFF0000000005254
R  G2    FEA3E8E39D337B1A
R  G13   87548D94EEA6ECCA
R  G24   850A7E9C5BCAF47C
*******************************************************************************
PHASE 0   INSTRUCTIONS I  0000000063278048  7D710214 * EA=6160000063278048  add G11, G17, G0
I  000000006327804C  E852148C * EA=616000006327804C  ld G2, 0x148C(G18)
* EA=FFF00000000066E0 (New) RA=00000000000066E0
I  0000000063278050  7CADC000 * EA=6160000063278050  cmp 0x01,0x01,G13,G24
I  0000000063278054  487A8028 * EA=6160000063278054  b 0x007A8028
* EA=6160000063A2007C (New) RA=0000000063A2007C
* 1 instr. inserted at a not taken leg at 6160000063278058
I  0000000063278058  4F734B42 * EA=6160000063278058  crorc 0x1B,0x13,0x09
DUMMY
```

FIG. 6

| PARAMETER | TEST CYCLE | | | | | |
|---|---|---|---|---|---|---|
| | 1 | 2 | 3 | 4 | 5 | 6 |
| IOIAR_L | 61600000 | 61600000 | 61600000 | 61600000 | 61600000 | 61600000 |
| IAR | 63278048 | 63278058 | 63A2007C | 63A20080 | 63A20080 | 63A20088 |
| R0VALID | 1 | 0 | 0 | 0 | 0 | 0 |
| S0VALID | 1 | 0 | 1 | 0 | 1 | 0 |
| M0VALID | 1 | 0 | 0 | 0 | 1 | 1 |
| B0VALID | 1 | 1 | 0 | 1 | 1 | 0 |
| R1VALID | 0 | 1 | 0 | 0 | 0 | 1 |
| S1VALID | 0 | 1 | 0 | 0 | 0 | 0 |
| M1VALID | 0 | 1 | 0 | 0 | 0 | 1 |
| B1VALID | 0 | 0 | 1 | 0 | 0 | 0 |
| R2VALID | 0 | 0 | 1 | 0 | 1 | 0 |
| S2VALID | 0 | 0 | 1 | 0 | 0 | 0 |
| M2VALID | 0 | 0 | 0 | 0 | 0 | 0 |
| B2VALID | 0 | 0 | 1 | 0 | 0 | 0 |
| R0INST | 7d710214 | 0 | 0 | 0 | 200 | 0 |
| S0INST | e852148c | 0 | 7c0004ac | 0 | 7c0004ac | 0 |
| M0INST | 7cadc000 | 0 | 0 | 0 | 200 | 0 |
| B0INST | 487a8028 | 4f734b42 | 0 | 0 | 4c00012c | 200 |
| R2CMPLETE | 0 | 0 | 1 | 0 | 0 | 0 |
| S2CMPLETE | 0 | 0 | 1 | 0 | 1 | 0 |
| M2CMPLETE | 0 | 0 | 1 | 0 | 0 | 0 |
| B2CMPLETE | 0 | 0 | 0 | 0 | 0 | 0 |
| R1STALL | 0 | 0 | 0 | 0 | 0 | 0 |
| S1STALL | 0 | 0 | 0 | 0 | 0 | 0 |
| M1STALL | 0 | 1 | 1 | 0 | 0 | 0 |
| STG2STALL | 0 | 0 | 0 | 0 | 0 | 0 |
| POPS | 4 | 1 | 1 | 0 | 2 | 0 |

FIG. 7

HEADER
SimRunSeed 887905804 TestCaseSeed 941802066 Generator Northstar.7.35 clock 1
R0Valid S0Valid M0Valid B0Valid
inst_num=1, instr=0x7d710214,stage=r0
inst_num=2, instr=0xe852148c,stage=s0,source_address=0x00000fff000066e0
inst_num=3, instr=0x7cadc000,stage=m0
inst_num=4, instr=0x487a8028,stage=b0
end of clock clock 2
B0Valid
inst_num=5, instr=0x4f734b42,stage=b0
inst_num=1, instr=0x7d710214,stage=r1
inst_num=2, instr=0xe852148c,stage=s1,source_address=0x00000fff000066e0
inst_num=3, instr=0x7cadc000,stage=m1
inst_num=4, instr=0x487a8028,stage=b1
end of clock clock 3
S0Valid
inst_num=6, instr=0x7c0004ac,stage=s0
inst_num=1, instr=0x7d710214,stage=r2,completed
inst_num=2, instr=0xe852148c,stage=s2,source_address=0x00000fff000066e0,
   completed
inst_num=3, instr=0x7cadc000,stage=m2,completed
inst_num=4, instr=0x487a8028,stage=b2,completed
end of clock clock 4
inst_num=6, instr=0x7c0004ac,stage=s1
end of clock clock 5
S0Valid B0Valid                                         800
inst_num=7, instr=0x7c0004ac,stage=s0
inst_num=8, instr=0x4c00012c,stage=b0
inst_num=6, instr=0x7c0004ac,stage=s2,completed
end of clock

FIG. 8

```
DefVersion: 1.26          Architecture: Pulsar
####  Global Policies                                    1300
GlobalVersion:        1.06
DefDescription:
DefDescription:
TestDescription:
TestFilename:         sample.tst
NumberOfTests:        1
NumberOfPhases:       1
InstructionsPerPhase: 5
RandomSeed:           0
IhFilename:           default.ih
ConfigFilename:       sample.cfg
####  Branch Not Taken
BNT: 0 1.01
####  Thread[default][default]
Thread:               0
ThreadVersion:        1.02       (Architecture: Pulsar)
InitialAddress:
RegisterAllocation: 2 1.02
RegUsePolicy:       InterDep
Activation:         100
Target-Source:      100
MemoryAllocation: 0 1.02
####  Cache
Cache:              0 1.03
SequencePolicy:     Random
ENTPolicy:          Random
RegisterInits:        0 1.00
CodeRanges:         0 0 1.02
DataRanges:           0 0 1.02
MixedRanges:        0 0 1.02
0    ###
Instruction - type label name has_bias has_field
0 . 1 add 0 0 0 0 0 0
1    ###
Instruction - type label name has_bias has_field
0 . 1 ld 0 0 0 0 0 0
2    ###
Instruction - type label name has_bias has_field
0 . 1 b 0 0 0 0 0 0
3    ###
Instruction - type label name has_bias has_field
0 . 1 cmp 0 0 0 0 0 0
4    ###
Instruction - type label name has_bias has_field
0 . 1 crorc 0 0 0 0 0 0
```

FIG. 13

INTEGRATED CIRCUIT TEST COVERAGE EVALUATION AND ADJUSTMENT MECHANISM AND METHOD

BACKGROUND OF THE INVENTION

1. Technical Field

This invention generally relates to the testing of integrated circuits, and more specifically relates to a computer mechanism and method for testing an integrated circuit for compliance with its architectural design parameters.

2. Background Art

The proliferation of modern electronics into our everyday life is due in large part to the existence, functionality and relatively low cost of advanced integrated circuits. As technology moves ahead, the sophistication of integrated circuits increases. An important aspect of designing an advanced integrated circuit is the ability to thoroughly test the design of the integrated circuit to assure the design complies with desired architectural, performance and design parameters. Testing a complex integrated circuit such as a super scaler microprocessor requires the generation of a large number of instruction sequences to assure that the microprocessor behaves properly under a wide variety of circumstances.

Referring to FIG. 2, one known system 200 for testing the design of a complex integrated circuit represents a method developed by IBM for integrated circuit design verification. Note that the term "integrated circuit" used in this specification refers to a single integrated circuit or a collection of integrated circuits that work to perform desired functions. System 200 includes a representation 210 of the integrated circuit in a hardware description language, such as VHDL or Verilog. A hardware description language is a computer-readable language that defines functional and performance parameters for the integrated circuit. The hardware description language representation 210 is compiled in step 220, which yields a simulation model 227. The simulation model 227 is a representation of all the components and their interconnections on the integrated circuit.

Simulation model 227 is used by a gate level cycle simulator 228 to perform test cycles to test the integrated circuit design. In addition, gate level cycle simulator 228 uses data from one or more testcases 225 to perform the cycle-by-cycle testing of the integrated circuit design. Testcases 225 may be generated by a testcase generator 224, which generates the testcases 225 in accordance with parameters specified in a testcase definition file 223. If testcase definition file 223 does not specify any parameters, testcase generator 224 generates truly random testcases. If, however, the testcase definition file 223 specifies one or more parameters, these parameters provide biasing to the testcase generator 224, which causes testcase generator 224 not to generate truly random testcases, but to generate testcases that are biased according to the parameters specified in testcase definition file 223. Testcase definition file 223 therefore provides a mechanism for biasing or "steering" the testcase generator to generate testcases that are more likely to test certain aspects of the integrated circuit design. An alternative to automatically generating somewhat random test cases using testcase generator 224 is to provide manually-written testcases 222 that are written by a designer to test the integrated circuit design for specific behavior.

In addition to the representation of the integrated circuit in hardware description language 210, there is also an architectural model 230 that defines the high-level architecture of the integrated circuit. This architectural model 230 specifies elements and features of the integrated circuit at a relatively high level. For example, the architectural model 230 for a microprocessor would include a specification of the number of general-purpose registers, the size of memory, the configuration of the program counter, etc. A simulator 240 uses the testcases 225 to generate expected results 260 that correspond to each test case. In addition, testcase generator 224 uses information from architectural model 230 to generate appropriate testcases 225 to test the integrated circuit design.

Testcases 225 may also be grouped into certain sets or subsets of tests to provide a greater likelihood of fully testing the integrated circuit design. Regression bucket 221 in FIG. 2 represents a container for groups of tests known as regression suites. The concept of regression suites is well-known in the art.

Gate level cycle simulator 228 uses testcases 225 to perform cycle-by-cycle tests of the integrated circuit design, typically using a single testcase for each simulation. When a testcase has been simulated by gate level cycle simulator 228, the results of the simulation are compared to the expected results 260 that correspond to the testcase that was just simulated. If the simulation results match the expected results 260 for the testcase, the testcase "passes", and the results of the simulation are used in determining test coverage of the integrated circuit design. If the simulation results do not match the expected results 260 for the testcase, the testcase "fails", and the results of the simulation are not used in determining test coverage, but rather the results of the failing test are examined to determine what failed in the integrated circuit design. When a testcase fails, the reason for the failure is repaired in the design, and the testcase is run again.

Once gate level cycle simulator 228 has performed test cycles that use all the testcases 225, the human operator running the tests typically evaluates test results 250 to determine how completely the gate level cycle simulator 228 has tested the design of the integrated circuit. Known methods of evaluating test results 250 to determine test coverage are very simplistic. The term "test coverage" as used in this specification relates to how completely the test patterns have tested the integrated circuit design.

One known way to attempt to get good test coverage is to run a set of one or more Architectural Verification Programs (AVPs) that test each use of every instruction in the architecture. However, running AVPs gives no information regarding how each test pattern actually runs on the integrated circuit. Again, using the example of a super scaler microprocessor, running AVPs gives no indication of whether instructions run in a non-pipelined manner or whether they run in a super scaler (i.e., pipelined) manner.

Another simplistic known way to evaluate test pattern coverage checks to see if all the pertinent signal lines in the integrated circuit change state during simulation of all the test patterns. Yet another simplistic known way to evaluate test pattern coverage looks for a particular event or sequence of events while running the test patterns, or looks to see if the gate level cycle simulator 228 passes through a particular state. These known methods of evaluating test coverage for an integrated circuit are woefully inadequate for complex integrated circuits such as super scaler microprocessors.

In sum, using prior art techniques of evaluating test pattern coverage, the human operator, by either manual inspection of test results or by using computers or other equipment to measure the quality of the test results, determines whether the integrated circuit has been fully tested, or whether the testcases have not fully tested all pertinent aspects of the design of the integrated circuit. For a relatively complex integrated circuit such as a super scaler microprocessor, it is common that not all of the desired functions are tested by gate level cycle simulator using the somewhat randomly-generated testcases. Furthermore, the very simplistic methods of evaluating test coverage that are known in the art provide very limited information regarding test coverage. As a result, certain bugs in the design of the integrated circuit may go undetected. Without an improved mechanism and method for testing an integrated circuit, the design of complex integrated circuits will not be fully tested, resulting in bugs in the design that are difficult to track down and very expensive to fix.

DISCLOSURE OF INVENTION

According to the present invention, an integrated circuit design is provided for testing. Testcases are run to test the design of the integrated circuit. The coverage of the testcases is evaluated and compared against one or more microarchitecture models that define the behavior of a portion of the integrated circuit. If the coverage of the testcases is not adequate, new testcases are generated to test the previously untested behavior specified in the microarchitecture models.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and:

FIG. 5 shows a sample testcase definition file for the processor of FIG. 4;

FIG. 6 shows a sample testcase for the processor of FIG. 4 that is generated according to the sample testcase definition file of FIG. 5;

FIG. 7 shows a sample trace file that results from running the sample testcase of FIG. 6;

FIG. 8 shows the trace file of FIG. 7 after post-processing;

FIG. 13 shows the testcase definition file of FIG. 5 after modification by the test coverage evaluation and adjustment mechanism of FIG. 1.

BEST MODE FOR CARRYING OUT THE INVENTION

The present invention is used in an environment for testing the design of integrated circuits. For those who are not familiar with the testing of integrated circuits, the brief overview below provides background information that will help the reader to understand the present invention.

1. Overview

Integrated Circuit Testing

The testing of complex integrated circuit designs, such as the design for a super scaler microprocessor, involves a myriad of different tests and types of tests. Super scaler microprocessors typically have multiple instruction pipelines that allow instructions to be fetched from memory and processed in parallel with the processing of other instructions. The performance of the various pipelines must be carefully tested to assure that the pipelines do not unexpectedly stall or become locked up. To test a microprocessor with multiple pipelines, a relatively large number of different instruction sequences is somewhat randomly generated and applied to the processor design. However, this process of testing processors with somewhat random sequences of instructions can leave some significant combinations of instructions untested.

The present invention alleviates the problems of untested combinations by providing microarchitecture models that specify most of the possible interactive behavior for the integrated circuit, and by providing a feedback mechanism that modifies the generation of testcases in a manner that will more likely produce testcases that will test the previously untested behavior of the integrated circuit design.

2. Detailed Description of the Preferred Embodiments

The preferred embodiments disclosed herein are significant improvements over the prior art methods for testing the design of a complex integrated circuit. One or more microarchitecture models are provided that specify the possible behaviors of the integrated circuit. After running a suite of testcases, the preferred embodiments of the invention automatically analyze the test pattern coverage for the testcases using the microarchitecture models, and modify the testcase definition file to bias the generation of testcases to test behavior that was previously untested. New testcases are generated, the coverage is evaluated, and the process is repeated as required until the integrated circuit design is tested to a predetermined level. For example, if 99% test coverage is desired, the preferred embodiments will iterate until 99% coverage is achieved, or will generate an error message after a predetermined number of iterations has been exceeded.

Figure 1:
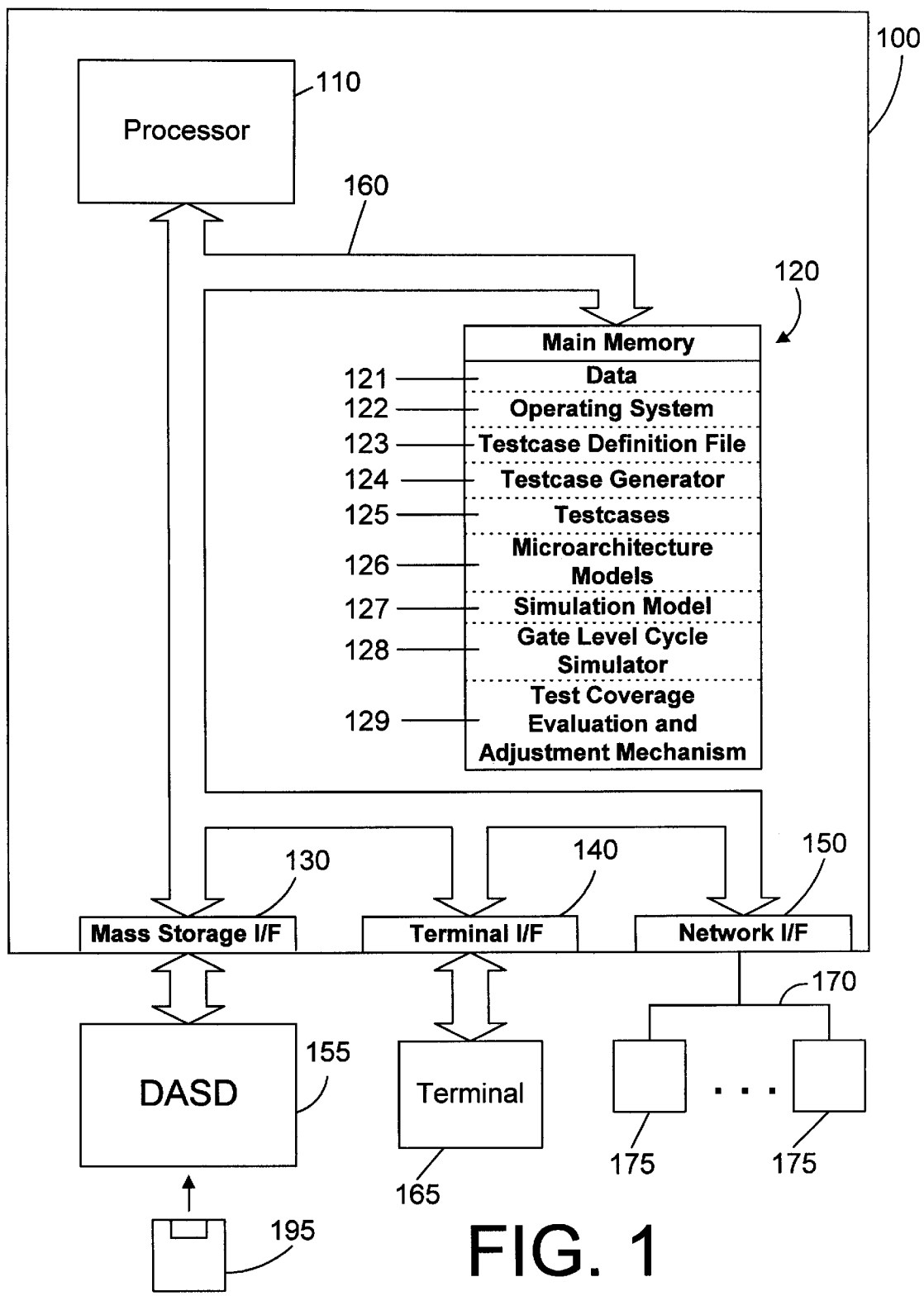
FIG. 1 is a block diagram of an apparatus in accordance with a preferred embodiment of the present invention.

Referring to FIG. 1, a computer system 100 in accordance with the preferred embodiment is an IBM RS/6000 computer system. However, those skilled in the art will appreciate that the mechanisms and apparatus of the present invention apply equally to any computer system, regardless of whether the computer system is a complicated multi-user computing apparatus or a single user workstation. As shown in FIG. 1, computer system 100 comprises a processor 110 connected to a main memory 120, a mass storage interface 130, a terminal interface 140, and a network interface 150. These system components are interconnected through the use of a system bus 160. Mass storage interface 130 is used to connect mass storage devices (such as a direct access storage device 155) to computer system 100. One specific type of direct access storage device is a floppy disk drive, which may store data to and read data from a floppy diskette 195.

Main memory 120 contains data 121, an operating system 122, a testcase definition file 123, a testcase generator 124, testcases 125, one or more microarchitecture models 126, a simulation model 127, a gate level cycle simulator 128, and a test coverage evaluation and adjustment mechanism 129 in accordance with the preferred embodiments. Computer system 100 utilizes well known virtual addressing mechanisms that allow the programs of computer system 100 to behave as if they only have access to a large, single storage entity instead of access to multiple, smaller storage entities such as main memory 120 and DASD device 155. Therefore, while data 121, operating system 122, testcase definition file 123, testcase generator 124, testcases 125, microarchitecture models 126, simulation model 127, gate level cycle simulator 128, and test coverage evaluation and adjustment mechanism 129 are shown to reside in main memory 120, those skilled in the art will recognize that these items are not necessarily all completely contained in main memory 120 at the same time. It should also be noted that the term "memory" is used herein to generically refer to the entire virtual memory of computer system 100.

Data 121 represents any data that serves as input to or output from any program in computer system 100. Operating system 122 is a multitasking operating system known in the industry as AIX; however, those skilled in the art will appreciate that the spirit and scope of the present invention is not limited to any one operating system. Testcases 125 are generated by testcase generator 124, which generates the testcases 125 in accordance with one or more parameters specified in testcase definition file 123. Testcase generator 124 suitably generates a relatively large number of somewhat random testcases. The parameters in testcase definition file 123 provide biasing to the testcase generator 124, which causes testcase generator 124 not to generate truly random testcases, but to generate testcases that are more likely to test specific behavior as specified by the parameters in testcase definition file 123.

Microarchitecture models 126 are a collection of low-level models that describe the possible behavior of the integrated circuit. For example, in a super scaler microprocessor, the various pipelines will interact with each other and with the instruction dispatcher in a particular way that is defined by one or more microarchitecture models 126. The term "microarchitecture models" as used herein refers to any type of model that may represent the possible behaviors of an integrated circuit. In the preferred embodiments, the microarchitecture models 126 specify detailed behavior of the integrated circuit design at a lower level than traditional architectural models, which explains their denomination herein as "microarchitecture models".

Simulation model 127 is a model of the integrated circuit that is compiled from a high level hardware description language, such as VHDL or Verilog. Simulation model 127 is a model of the integrated circuit that is in a format that can be interpreted by gate level cycle simulator 128, which applies the testcases 125 to the simulation model 127 to determine if the simulated integrated circuit behaves as expected. Test coverage evaluation and adjustment mechanism 129 is used to compare the results of running testcases 125 on simulation model 127 to the microarchitecture models 126.

Processor 110 may be constructed from one or more microprocessors and/or integrated circuits, and may include multiple instruction pipelines that can execute instructions in parallel. Processor 110 executes program instructions stored in main memory 120. Main memory 120 stores programs and data that processor 110 may access. When computer system 100 starts up, processor 110 initially executes the program instructions that make up operating system 122. Operating system 122 is a sophisticated program that manages the resources of computer system 100. Some of these resources are processor 110, main memory 120, mass storage interface 130, terminal interface 140, network interface 150, and system bus 160.

Although computer system 100 is shown to contain only a single processor and a single system bus, those skilled in the art will appreciate that the present invention may be practiced using a computer system that has multiple processors and/or multiple buses. In addition, the interfaces that are used in the preferred embodiment each include separate, fully programmed microprocessors that are used to off-load compute-intensive processing from processor 110. However, those skilled in the art will appreciate that the present invention applies equally to computer systems that simply use I/O adapters to perform similar functions.

Terminal interface 140 is used to directly connect one or more terminals 165 to computer system 100. These terminals 165, which may be non-intelligent (i.e., dumb) terminals or fully programmable workstations, are used to allow system administrators and users to communicate with computer system 100. Note, however, that while terminal interface 140 is provided to support communication with one or more terminals 165, computer system 100 does not necessarily require a terminal 165, because all needed interaction with users and other processes may occur via network interface 150.

Network interface 150 is used to connect other computer systems and/or workstations (e.g., 175 in FIG. 1) to computer system 100 across a network 170. The present invention applies equally no matter how computer system 100 may be connected to other computer systems and/or workstations, regardless of whether the network connection 170 is made using present-day analog and/or digital techniques or via some networking mechanism of the future. In addition, many different network protocols can be used to implement a network. These protocols are specialized computer programs that allow computers to communicate across network 170. TCP/IP (Transmission Control Protocol/Internet Protocol) is an example of a suitable network protocol.

It is also important to point out that the presence of network interface 150 within computer system 100 means that computer system 100 may engage in cooperative processing with one or more other computer systems or workstations on network 170. Of course, this in turn means that the programs and data shown in main memory 120 need not necessarily all reside on computer system 100. For example, one or more computer programs may reside on another system and engage in cooperative processing with one or more programs that reside on computer system 100. This cooperative processing could be accomplished through use of one of the well known client-server mechanisms such as remote procedure call (RPC).

At this point, it is important to note that while the present invention has been and will continue to be described in the context of a fully functional computer system, those skilled in the art will appreciate that the present invention is capable of being distributed as a program product in a variety of forms, and that the present invention applies equally regardless of the particular type of signal bearing media used to actually carry out the distribution. Examples of suitable signal bearing media include: recordable type media such as floppy disks (e.g., 195 of FIG. 1) and CD ROM, and transmission type media such as digital and analog communications links.

Figure 2:
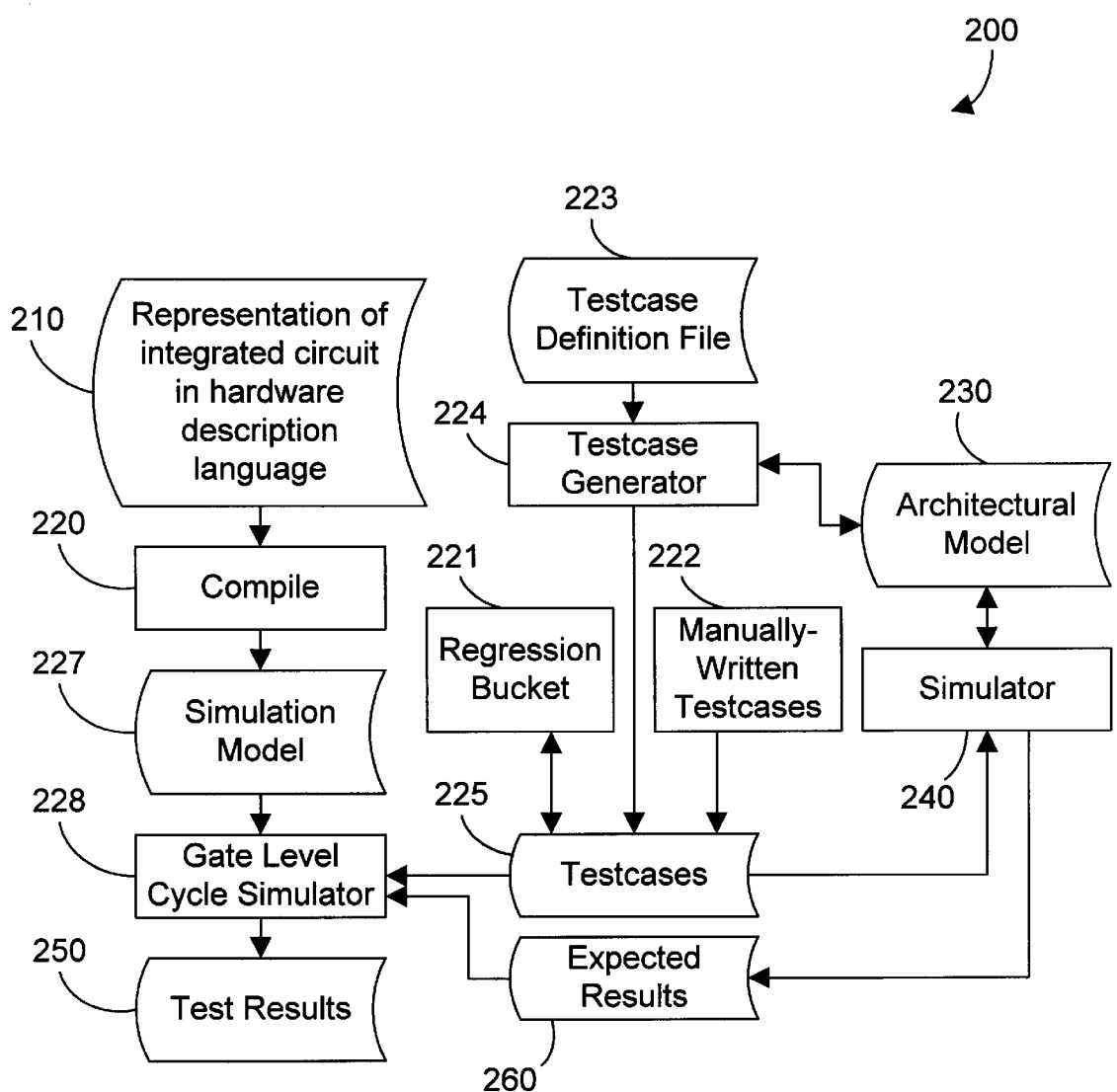
FIG. 2 is a flow diagram of a method for testing an integrated circuit in accordance with the prior art.
Figure 3:
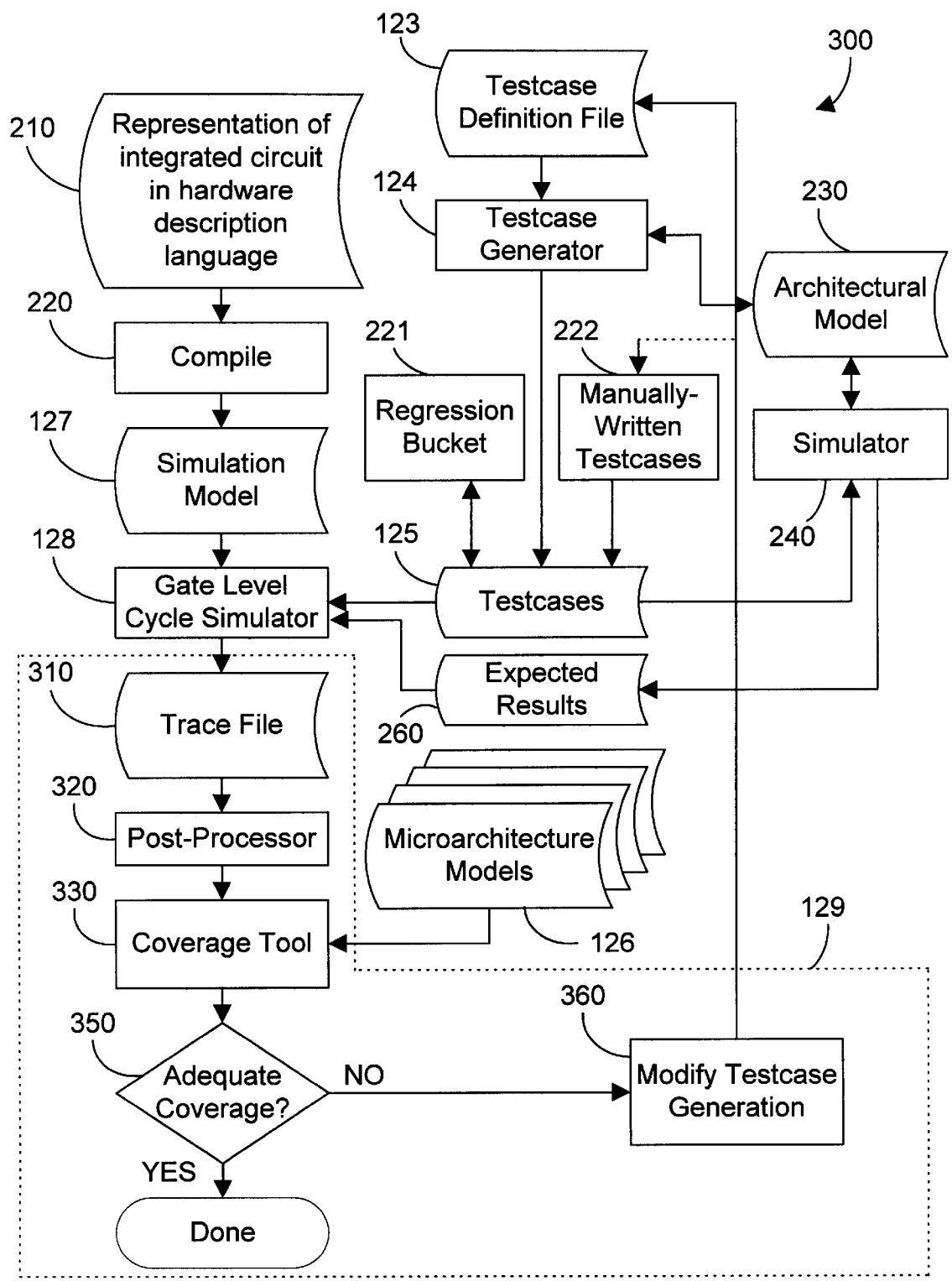
FIG. 3 is a flow diagram of a method for testing an integrated circuit in accordance with a preferred embodiment of the present invention.

Referring to FIG. 3, a system 300 for testing an integrated circuit design in accordance with the preferred embodiment includes a representation 210 of the integrated circuit in a hardware description language. This representation 210 is compiled in step 220 into a simulation model 127. As with the prior art system 200 in FIG. 2, testcase generator 124 generates testcases 125 in a semi-random manner that is biased according to parameters specified in testcase definition file 123. In addition, simulator 240 processes architectural model 230 and testcases 125 to determine expected results 260 from running the testcases. Gate level cycle simulator 128 runs the testcases against the simulation model 127, and compares the results with the expected results 260. If the results are as expected, the testcase "passes", and the data is used by test coverage evaluation and adjustment mechanism 129 to determine if the design has been adequately tested. If the testcase "fails", the data from the test is used to find the design error, the design error is corrected, and the testcase is run again. If the testcase then passes, the information from running the testcase is written to trace file 310.

Test coverage evaluation and adjustment mechanism 129 of FIG. 1 is shown in more detail in FIG. 3, and includes a trace file 310, a post-processor 320, a coverage tool 330, and a mechanism 360 for modifying the generation of new testcases. Trace file 310 is a file of somewhat raw data that is compiled as gate level cycle simulator 128 runs a particular testcase. This raw data is processed by post-processor 320 to a more usable form. The post-processed test data is used by coverage tool 330 to determine which aspects of microarchitecture models 126 have been tested. If the microarchitecture models 126 have been adequately tested (step 350=YES), the testing of the integrated circuit design is complete. If not (step 350=NO), mechanism 360 modifies testcase generation (step 360), either by 1) modifying definition file 123 in a manner that will likely bias the generation of new testcases 125 by testcase generator 124 that will test the as-yet untested aspects of the integrated circuit design; or 2) producing a manually-written testcase 222.

In some cases, very specific parameters may need to be tested, which are more easily tested by manually generating a testcase than relying on the testcase generator 124 to generate an appropriate testcase. A designer can use an editing tool to manually generate such a testcase 222, which may then be run against the design of the integrated circuit. The manual generation of testcases is represented in FIG. 3 as a dotted line going into box 222.

Determining the adequacy of the test coverage (as in step 350 of FIG. 3) depends on a myriad of factors. If 100% testing is desired, step 350 will require that all aspects of microarchitecture models 126 are tested. However, for some designs, or for some stages of testing, less than 100% testing may be desired. Step 350 allows the designer to specify the degree of test coverage that is adequate. If adequate test coverage is not achieved on the first pass, step 360 will modify the testcase generation to achieve one or more testcases that test the as-yet untested aspects of the microarchitecture models 126 during the next iteration. This process will continue until step 350 determines that the test coverage is adequate. In addition, a predetermined limit on the number of iterations or the testing time may be specified that halts the iterations after the limit is met or exceeded, even though the test coverage is not adequate. Furthermore, many conditions in a test may be marked as not possible conditions, thereby reducing the number of tests that need to be performed. This allows a designer to only consider the valid scenarios for the microarchitecture models.

Step 360 of modifying testcase generation may be performed in any suitable way. In one embodiment of the invention, a human operator manually analyzes the test coverage as an output from coverage tool 330, and manually modifies the testcase definition file 123 to bias the generation of testcases 125 by testcase generator 124 to test previously untested behavior as specified in the microarchitecture models 126. In another embodiment, a mechanism is used to automatically analyze an output from coverage tool 330 and to appropriately modify the testcase definition file 123 without requiring input by a human user. In yet another embodiment, a user writes a manually-written testcase 222 that is designed to test specific behavior of the integrated circuit. These and all other ways of modifying testcase generation are expressly within the scope of the present invention.

Figure 4:
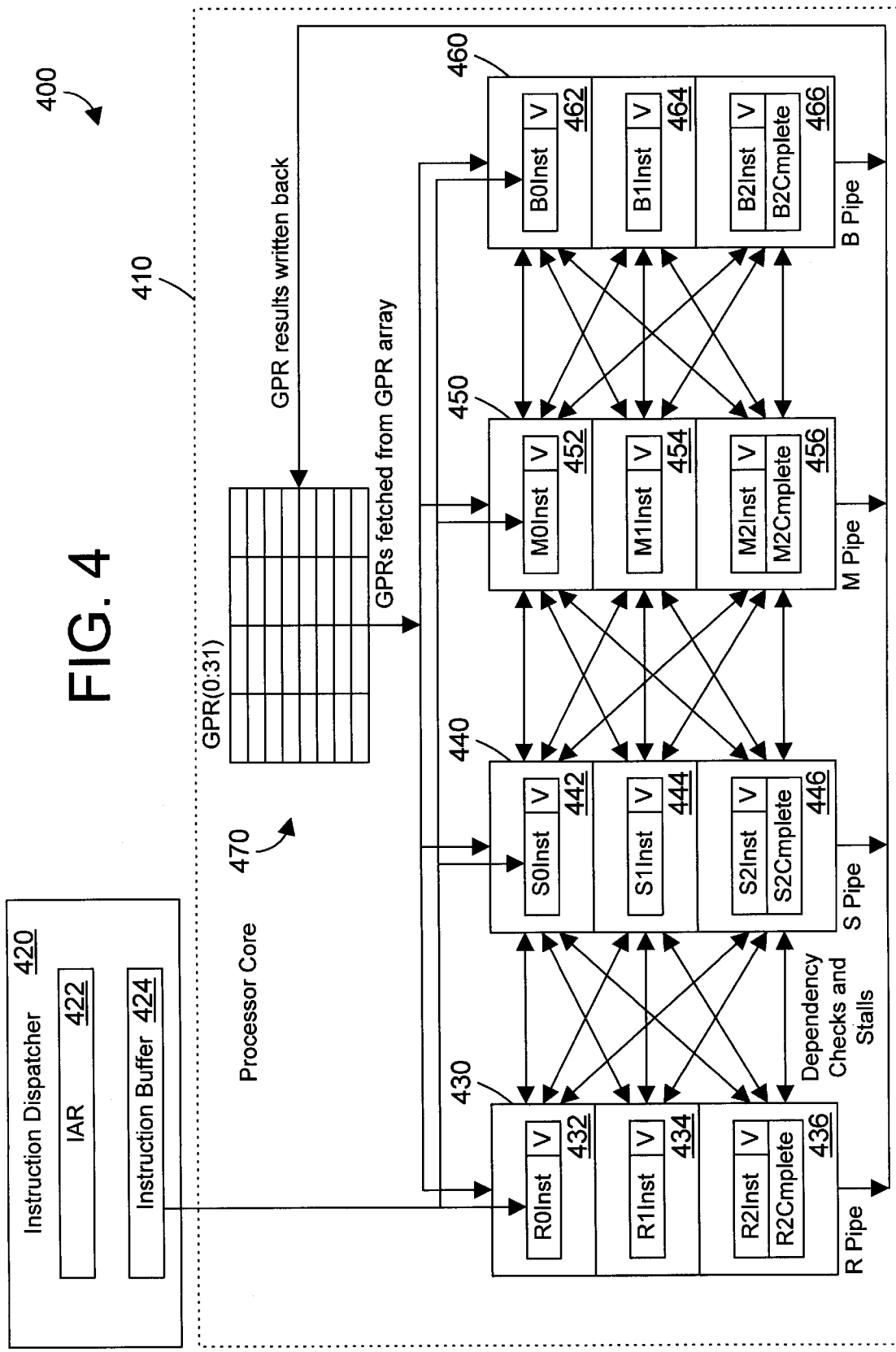
FIG. 4 is a block diagram of a sample processor with four instruction pipelines that may be represented in virtual hardware description language (VHDL) as an example to illustrate the concepts of the preferred embodiment.

A specific example will help to illustrate the pertinent aspects of the present invention. Referring to FIG. 4, a block diagram of a microprocessor core 410 and instruction dispatcher 420 is provided as a sample of an integrated circuit portion that needs to be tested. Of course, the invention applies to integrated circuit designs that are very complex. The simplified example of FIG. 4 is used simply to illustrate the concepts of the present invention, and should not be construed as limiting. While the specific hardware description language representation 210 of the circuit of FIG. 4 is not shown herein due to its size, one skilled in the art will recognize how to convert the elements in the block diagram of FIG. 4 into a suitable representation 210 in hardware description language.

Instruction dispatcher 420 includes an instruction address register (IAR) 422 and an instruction buffer 424. Instruction dispatcher 420 dispatches instructions from instruction buffer 424 to the microprocessor core 410 as required.

Microprocessor core 410 includes, for purpose of illustration, four instruction pipelines: an R pipe 430, an S pipe 440, an M pipe 450, and a B pipe 460. These pipes are designated R, S, M and B as random labels for these pipes. Each pipe is divided into three stages. For example, the R pipe 430 has three stages, namely stage zero 432, stage one 434 and stage two 436. The first stage (stage zero) for the R pipe 430 is R0, and includes an instruction register R0Inst and a valid bit V. The instruction register R0Inst contains the instruction that is being processed in stage zero 432 of the R pipe 430, and the valid bit V is a flag that indicates whether the instruction in that stage is valid. In similar fashion, stage one 434 of the R pipe 430 has an instruction register R1Inst and a corresponding valid bit, and stage two 436 also has an instruction register R2Inst and a corresponding valid bit. In addition, stage two 436 also includes a tag R2Cmplete that indicates that an instruction just completed execution in the R pipe 430. Note that pipes S 440, M 450, and B 460 each have three stages (stages zero through two) with registers and valid bits that correspond to those discussed above with regard to the R pipe 430.

Instruction dispatcher 420 dispatches instructions residing in instruction buffer 424 to pipes 430, 440, 450 and 460 as the pipes are able to take a new instruction in their first stage. The dependencies between instructions in the different pipes is analyzed in the first stage. For example, if one instruction adds A to B and puts the result in C, and the following instruction uses C in a computation, the second instruction cannot complete until the first instruction has been processed. If a dependency exists, the pipeline stalls until the dependent instruction completes and makes the required data available, which is then bypassed into the stalled pipe. At this point the instruction can continue execution, and processing continues. The dependency checks and stalls between pipes are shown between adjacent pipes as arrows, but one skilled in the art will recognize that the R pipe 430 will also have dependency checks and stalls with M pipe 450. While these relationships are not explicitly shown in FIG. 4 to provide clarity in the drawing, they are nevertheless understood to be present.

Microprocessor core 410 includes an array 470 of thirty-two general purpose registers, GPR0 through GPR31. When an instruction has a general purpose register as an operand, the data is fetched from the general purpose registers into the pipe processing the instruction. Likewise, when an instruction modifies a general purpose register, the result of the instruction is written back to the appropriate general purpose register when the processing of the instruction is complete.

A portion of a testcase definition file 123 for the processor core of FIG. 4 is represented as item 500 in FIG. 5. The first line shows DefVersion: 1.26, which represents the version of the graphical user interface used to generate this testcase definition file 500. Many of the parameters are followed by version numbers, such as 1.02 and 1.03. These numbers represent the version number of testcase generator 124 that is required by this function. For the specific testcase definition file 500 of FIG. 5, testcase generator 124 must be version 1.06 or newer for this testcase definition file 500 to work, because the GlobalVersion is specified at 1.06. In addition, many of the parameters are followed by numerical bias values that are set (for this particular example) between 0 and 100. The bias value is typically a weighted value, so if all of four related parameters are set to 100, each would have a 25% effect.

The DefDescription and TestDescription lines allow a user to enter a description of the testcase definition file and of the test, respectively. TestFileName is the name of a testcase 125 that will be generated using this testcase definition file 123. Testcase definition file 500 of FIG. 5 will generate a testcase named "sample.tst". NumberOftests specifies the number of testcases 125 to create from this testcase definition file 123. RandomSeed is a seed number for a random number generator that drives the testcase generator 124. By specifying the same seed and the same version of the testcase generator, the same testcase will always result.

The IhFilename specifies the name of the file that is the interrupt handler for this particular testcase, which is "default.ih" for the testcase definition file 500 of FIG. 5. The ConfigFileName parameter specifies the name of a configuration file that is used to input certain configuration data into the testcase, such as cache size and the number of processors. In FIG. 5, the ConfigFileName is "sample.cfg".

The Branch not Taken parameter BNT specifies the number of instructions in the not taken branch. For this example, BNT is set to 1, which means that there is one instruction in the not taken branch of the code. One skilled in the art will recognize that there are many reasons for defining instructions in a branch that is not taken, especially in the context of super scaler microprocessors whose pipelines need to be kept active until the end of the test.

The next section governs how threads are used duing execution of a testcase. The first parameter ThREAD: 0 specifies that this testcase is to run on thread 0. ThreadVersion specifies the thread version number required for this testcase. InitialAddress specifies an initial address, which is left blank in this example. Testcase generator 124 will interpret the blank to mean that the initial address will be random. The MemoryAllocation parameter is set to 0, which means that there are no memory allocations for this testcase. If a number n is specified in this parameter, it will be followed by n memory allocations.

The Cache parameter determines cache biasing, which is set to zero in this case. The SequencePolicy parameter is set to Random, indicating that cache is allocated in a random manner. The RegisterInits parameter is set to 0, indicating that no registers are initialized for this testcase. When RegisterInits is set to some number n, the RegisterInits parameter is followed by n register initializations.

The parameters CodeRanges, DataRanges, and MixedRanges are used to specify addresses where code, data, and both code and data, respectively, can exist. These parameters are set to zero, indicating that there are no pre-defined memory ranges for code or data. When any of these parameters are followed by a parameter n, there will be n lines that follow, indicating the allowable ranges of addresses.

The Instruction statements in the testcase definition file 123 are the instructions that the test generator must choose from. In this case, there is an add instruction "add", a load instruction "ld", a branch instruction "b", a compare instruction "cmp", and a condition register OR with complement instruction "crorc".

A portion of a testcase 125 for the processor core of FIG. 4 is represented as item 600 in FIG. 6. This testcase is one possible testcase that could be generated by testcase generator 126 based on testcase definition file 123. This particular testcase initializes data memory, initializes the instruction address register (IAR) and the appropriate general purpose registers, and provides the instructions that make up the test. This particular testcase includes the five instructions specified in the testcase definition file 500, namely: an add, a load (ld), a compare (cmp) a branch (b), and a condition register OR with complement instruction (crorc).

A specific example 700 of a trace file 310 for the processor core of FIG. 4 is shown in FIG. 7. The trace file contains variables of interest and their values after running a particular testcase. The IAR parameter is the instruction address register. The IOIAR_L parameter represents a high-order base address that is used to offset the address in the instruction address register IAR. The R0VALID, S0VALID, M0VALID, and B0VALID parameters are flags that correspond to the valid bits in stage zero of each pipe shown in FIG. 4. The R1VALID, S1VALID, M1VALID, and B1VALID parameters are flags that correspond to the valid bits in stage one of each pipe. The R2VALID, S2VALID, M2VALID, and B2VALID parameters are flags that correspond to the valid bits in stage two of each pipe. The R0INST, S0INST, M0INST, and B0INST parameters are registers that hold the values of the corresponding pipe registers in FIG. 4. The R1STALL parameter is a flag that indicates when set that pipe R has stalled between stage one and stage two. Similarly, S1STALL, M1STALL, and B1STALL indicate stalls in those pipes between the second and third stages as well. The STG2STALL is a parameter that is a logical OR of all stage two stalls in all pipelines. The R2CMPLETE, S2CMPLETE, M2CMPLETE, and B2CMPLETE parameters represent the state of the corresponding registers in stage two of each of the pipes of FIG. 4. The POPS parameter represents the number of instructions dispatched in that cycle.

Once a testcase has been processed by gate level cycle simulator 128 and "passes", which means that the results are the same as the expected results 260, the "raw data" in trace file 310 shown in FIG. 7 is processed by post-processor 320 to a more abbreviated and usable form as shown in FIG. 8. The post-processed data shows the pertinent information for each of the 5 clock cycles that were needed to process the five instructions in the sample testcase 600 of FIG. 6. During the first clock cycle, clock 1, all of the valid bits in stage zero for each pipe are set, indicating a valid instruction is dispatched to each pipe during that clock cycle.

As the results in the clock 1 section of FIG. 8 show, the first instruction, inst_num=1, is dispatched to stage r0, which is stage zero 432 of pipe R 430. In like manner, the next three instructions are dispatched to stage zero of the remaining three pipes. This concludes the results of the first clock.

During clock 2, the B0Valid bit is set, indicating that stage zero 462 of B pipe 460 is dispatched a new instruction to process during the second clock. This is further confirmed by the next statement, showing that the fifth instruction, inst_num=5, is dispatched to stage zero 462 of the B pipe 460. The remaining instructions, inst_n=1 through inst_num=4 all progress to stage 1 of their respective pipes. This concludes the results of the second clock.

During clock 3, the S0Valid bit is set, indicating that stage zero 442 of S pipe 440 is dispatched a new instruction to process during the third clock. This is further confirmed by the next statement, showing that a sixth instruction, inst_num=6, is dispatched to stage zero 442 of the S pipe 440. Note that while testcase 600 of FIG. 6 shown only five instructions, we assume that the testcase also specifies other instructions in an epilogue (not shown) that are processed as required during the processing of the five instructions of interest. Therefore, while testcase 600 does not include a sixth instruction, we assume that a sixth instruction is dispatched to stage zero 442 of S pipe 440 during clock 3. The remaining instructions, inst_num=1 through inst_num=4 all progress to stage 2 of their respective pipes. As a result, the processing of all of these instructions is completed. This concludes the results of the third clock. During clock 4, no instructions are dispatched to any of the pipes, but the sixth instruction inst_num=6 progresses to stage one 444 of S pipe 440. This concludes the results of the fourth clock.

During clock 5, both S0Valid and B0Valid are set, indicating that stage zero 442 of the S pipe 440 and stage zero 462 of the B pipe 460 are both dispatched new instructions to process. This is further confirmed in the next two statements, which indicate that a seventh instruction and an eighth instruction are dispatched to stage zero of pipes S and B, respectively. The sixth instruction progresses to stage two 446, and is completed. This concludes the results of the fifth and last clock.

Figure 9:
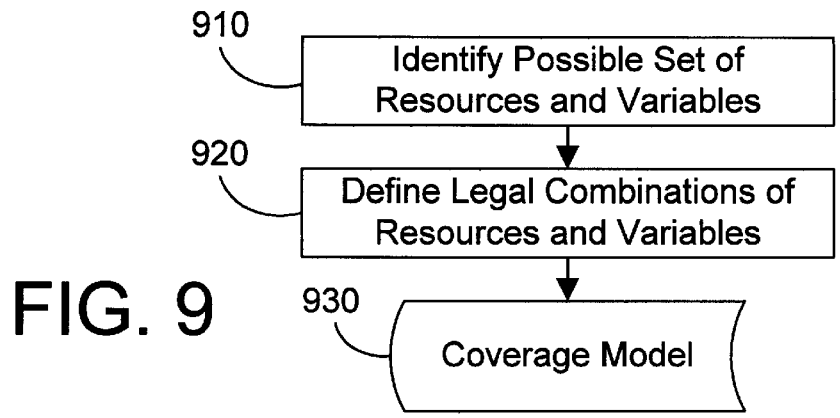
FIGS. 9–11 each show different microarchitecture models that may be used to check the coverage of testcases in testing the design of an integrated circuit.

Coverage tool 330 of FIG. 3 compares the output of post-processor 320 as shown in FIG. 8 against expected parameters specified in one or more microarchitecture models 126, some examples of which are represented in FIGS. 9–12. Referring to FIG. 9, a microarchitecture model 126 known as a "coverage model" 930 is created by identifying an important set of resources and variables (step 910), and by defining the possible legal combinations of resources and variables (step 920). Coverage tool 330 then measures the coverage of legal combinations specified in the coverage microarchitecture model against the data in the post-processed trace file. If adequate coverage is not achieved (step 350=NO), testcase generation is modified (step 360) to generate testcases that will likely test the untested combinations. For example, if dependencies between pipelines need to be tested, a parameter may be included in the testcase definition file 123 that specifies that register usage should be interdependent.

Figure 10:
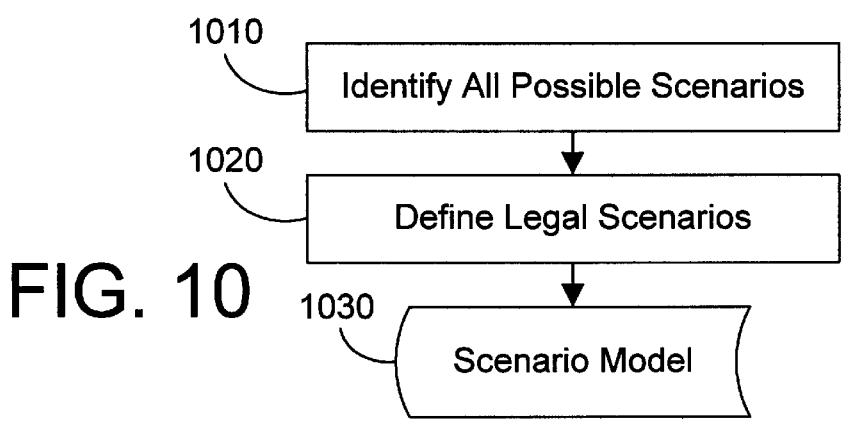

Referring to FIG. 10, another microarchitecture model 126 known as a "scenario model" 1030 is created by first listing all possible scenarios (step 1010). A scenario is usually in the form of "first X happened, then Y, and then Z", where X, Y and Z are events or sets of events. The possible scenarios are then processed to determine which are legal scenarios for the design of the integrated circuit (step 1020). The legal scenarios are specified in the microarchitecture scenario model, and the coverage tool compares these legal scenarios against the actual scenarios that are reflected in the post-processed trace data to determine the coverage of scenarios. If adequate coverage is not achieved (step 350=NO), testcase generation is modified (step 360) to generate testcases that will likely test the untested scenarios.

Both the coverage model 930 of FIG. 9 and the scenario model 1030 of FIG. 10 can be represented as a tuple (X,Y,Z,W . . . q). Tasks are an instantiation of each the variables. Restrictions may be placed on the tuples. For example, one or more logical restrictions may constrain the choice of values for tasks or scenarios. Examples of logical restrictions include: X>Y, X+Y=11, and if S>5, then Y=0. In addition, there may also be restrictions on the trace. Assuming X and Y are instructions, some examples of trace restrictions include: there is no branch between X and Y in the program order; Y is after X; and the instruction before Y caused an interrupt. In addition, sub-models may also be generated. An example of a sub-model follows. Let A be the model to be represented by the tuple (X,Y,Z,W). Let B be a sub-model (X,Y). A restriction may be made in the form of "task(x,y,z,w) is not legal if task(x,y) is not legal". This sub-model restriction allows the size of larger models to be limited.

Figure 11:
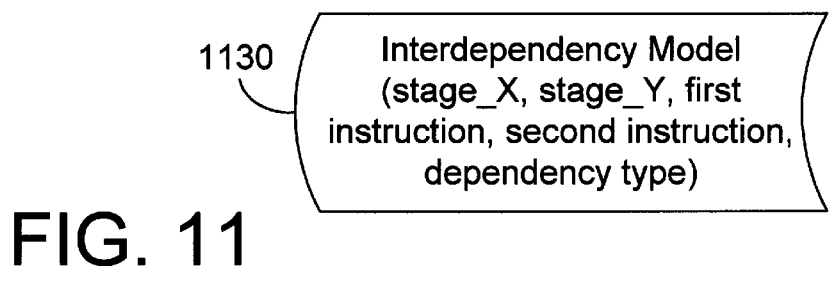

Another microarchitecture model 126 that can be tested is known as an interdependency model 1130, and is represented in FIG. 11. The interdependency model can test the interdependencies between pipelines in a super scaler microprocessor. The model uses a tuple in the form (stage_X, stage_Y, first instruction, second instruction, dependency type). Stage_X corresponds to one stage of a pipeline, stage_Y corresponds to the stage of the pipeline that follows the stage represented by stage_X, first instruction corresponds to the instruction being executed by the stage corresponding to stage_X, the second instruction corresponds to the instruction being executed by the stage corresponding to stage_Y, and the dependency type specifies the type of dependency that exists for these two instructions in these two stages of the pipelines.

For the purpose of illustrating the present invention, we assume that an interdependency model 1130 is applied as the relevant microarchitecture model 126 for the processor core shown in FIG. 4. The testcase 600 of FIG. 6 failed to generate any instructions with dependencies, so testcase 600 does not provide any useful results regarding how well the pipes in FIG. 4 operate in the presence of dependencies. As a result, the coverage of the testcase 600 is inadequate, so step 350 of FIG. 3 is NO, and the testcase generation must be modified in step 360 to provide testcases that will provide interdependent instructions so that dependencies in the instructions may be tested. Referring to FIG. 13, the testcase definition file 500 of FIG. 5 has been modified to create a new testcase definition file 1300 that includes a new parameter RegisterAllocation that specifies the number of lines to follow that govern register allocation The argument 2 in RegisterAllocation is a binary value that indicates that three lines follow that govern register allocation (as in lines corresponding to binary values 0, 1 and 2). The RegUsePolicy parameter specifies InterDep, which will bias the generation of testcases in a manner that will produce instructions that have interdependencies on their use of registers. The Activation parameter is set to 100 to specify that there should always be a dependency. The Target-Source parameter specifies that the type of dependency to create is a target-source dependency. Other possible dependencies not specified here are target-target, source-source, and source-target. This modified testcase definition file 1300 is one specific example of how a testcase definition file 123 can be modified to bias the generation of testcases to obtain better coverage. The present invention expressly encompasses any and all means and parameters for modifying testcase generation to obtain better coverage on a subsequent iteration.

Figure 12:
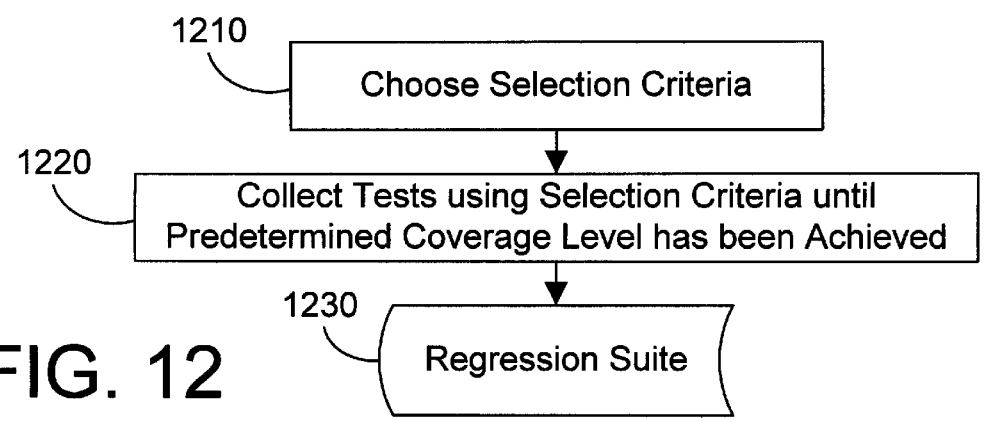
FIG. 12 shows a regression suite that may be generated from several iterations of running testcases.

One result from using the invention described herein is known as a regression suite 1230, represented in FIG. 12. A regression suite is specified by choosing a selection criteria (step 1210), and by collecting tests using the selection criteria from all the tests executed until a predefined coverage level (such as 99%) of the tasks has been achieved (step 1220). Then, a compaction algorithm can be used to find a small subset of the selected tests with the needed coverage criteria that constitute the regression model 1230. For example, a regression suite could find the smallest subset of tests with 100% coverage; find one hundred tests with the best coverage; or find the smallest subset in which every task is covered twice. The concept of a regression suite may be extended to different coverage models. A compacted regression suite could be made for each model while running a number of regression suites at the same time. This second regression suite could then be compacted taking into account the tasks covered in the first suite, and this process could iterate for each subsequent suite taking into account all the tasks covered in the tasks covered in the previously selected tests. Regression suites 1230 thus provide a powerful way to combine tests from one or many microarchitecture models 126 to provide better test coverage. Note that a regression suite 1230 may be marketed separately as a product for use in testing similar types of integrated circuits.

The present invention is an improvement over the prior art by providing one or more microarchitecture models, evaluating test coverage on a complex integrated circuit design by comparing test results to the microarchitecture models, and by adjusting the generation of testcases to adequately test the integrated circuit design. By providing a feedback mechanism to adjust the generation of testcases, the design of an integrated circuit can be more fully tested by iterating through more refined testing steps, thereby eliminating many bugs that might otherwise go undetected using prior art testing techniques.

One skilled in the art will appreciate that many variations are possible within the scope of the present invention. Thus, while the invention has been particularly shown and described with reference to preferred embodiments thereof, it will be understood by those skilled in the art that these and other changes in form and details may be made therein without departing from the spirit and scope of the invention.

We claim:

1. An apparatus comprising:
    at least one processor;
    a memory coupled to the at least one processor;
    an integrated circuit design residing in the memory;
    a plurality of testcases residing in the memory for testing the integrated circuit design; and
    a test coverage evaluation and adjustment mechanism residing in the memory and executed by the at least one processor, the test coverage evaluation and adjustment mechanism evaluating test coverage for the plurality of testcases, the test coverage comprising a measure of how completely the plurality of testcases tests the integrated circuit design, the test coverage evaluation and adjustment mechanism causing new testcases to be automatically generated that are biased to more thoroughly test the integrated circuit design if the test coverage is inadequate.

2. The apparatus of claim 1 wherein the test coverage is inadequate if the test coverage is below a predetermined value.

3. The apparatus of claim 1 further comprising at least one microarchitecture model residing in the memory, the at least one microarchitecture model defining behavior for at least a portion of the integrated circuit design.

4. The apparatus of claim 1 wherein the integrated circuit design comprises a design of a super scaler microprocessor having a plurality of instruction pipelines, the apparatus further comprising an interdependency microarchitecture model residing in the memory, the interdependency microarchitecture model defining a plurality of interdependencies between the plurality of instruction pipelines.

5. The apparatus of claim 1 further comprising a testcase definition file residing in the memory, wherein the test coverage evaluation and adjustment mechanism causes new testcases to be automatically generated that are biased to more thoroughly test the integrated circuit design by modifying the testcase definition file.

6. An apparatus comprising:
    at least one processor;
    a memory coupled to the at least one processor;
    an integrated circuit design residing in the memory;
    a plurality of testcases residing in the memory for testing the integrated circuit design; and
    means for automatically generating at least one new testcase to test the integrated circuit design based on comparing 1) the results of applying the plurality of testcases to the integrated circuit design with 2) at least one microarchitecture model of the integrated circuit design.

7. The apparatus of claim 6 wherein the at least one microarchitecture model defines behavior for at least a portion of the integrated circuit design.

8. The apparatus of claim 6 wherein the integrated circuit design comprises a design of a super scaler microprocessor having a plurality of instruction pipelines, the apparatus further comprising an interdependency microarchitecture model residing in the memory, the interdependency microarchitecture model defining a plurality of interdependencies between the plurality of instruction pipelines.

9. A method for testing an integrated circuit design, the method comprising the step of:
    automatically generating at least one new testcase to test the integrated circuit design based on comparing 1) the results of applying a plurality of testcases to the integrated circuit design with 2) at least one microarchitecture model of the integrated circuit design.

10. The method of claim 9 wherein the at least one microarchitecture model defines behavior for at least a portion of the integrated circuit design.

11. The method of claim 9 wherein the integrated circuit design comprises a design of a super scaler microprocessor having a plurality of instruction pipelines, and wherein the at least one microarchitecture model comprises an interdependency microarchitecture model that defines a plurality of interdependencies between the plurality of instruction pipelines.

12. The method of claim 9 wherein the step of automatically generating at least one new testcase comprises the steps of:
    modifying a testcase definition file that provides parameters for biasing the generation of the at least one new testcase; and a testcase generator automatically generating the at least one new testcase in accordance with the modified testcase definition file.

13. A method for testing an integrated circuit design, the method comprising the steps of:
   (A) applying a plurality of testcases to a simulation model of the integrated circuit design;
   (B) providing at least one microarchitecture model of the integrated circuit design, the microarchitecture model defining behavior for at least a portion of the integrated circuit design;
   (C) comparing the results of applying the plurality of testcases to the simulation model of the integrated circuit design to the at least one microarchitecture model; and
   (D) automatically generating at least one new testcase that provides improved test coverage based on the compared results.

14. The method of claim 13 wherein the integrated circuit design comprises a design of a super scaler microprocessor having a plurality of instruction pipelines, and wherein the at least one microarchitecture model comprises an interdependency microarchitecture model that defines a plurality of interdependencies between the plurality of instruction pipelines.

15. The method of claim 13 wherein the step of automatically generating at least one new testcase comprises the steps of:
   modifying a testcase definition file that provides parameters for biasing the generation of the at least one new testcase; and
   a testcase generator automatically generating the at least one new testcase in accordance with the modified testcase definition file.

16. The method of claim 13 further comprising the steps of:
   (E) applying the at least one new testcase to the simulation model; and
   (F) repeating steps (C), (D) and (E) until a predetermined level of test coverage is achieved.

17. A product comprising a regression suite of all the testcases generated by the method of claim 16.

18. A computer readable program product comprising:
   (A) a test coverage evaluation and adjustment mechanism that evaluates test coverage for a plurality of testcases for an integrated circuit design, the test coverage comprising a measure of how completely the plurality of testcases tests the integrated circuit design, the test coverage evaluation and adjustment mechanism causing new testcases to be automatically generated that are biased to more thoroughly test the integrated circuit design if the test coverage is inadequate; and
   (B) computer readable signal bearing media bearing the test coverage evaluation and adjustment mechanism.

19. The program product of claim 18 wherein the signal bearing media comprises recordable media.

20. The program product of claim 18 wherein the signal bearing media comprises transmission media.

21. The program product of claim 18 wherein the test coverage is inadequate if the test coverage is below a predetermined value.

22. The program product of claim 18 further comprising at least one microarchitecture model residing in the memory, the at least one microarchitecture model defining behavior for at least a portion of the integrated circuit design.

23. The program product of claim 18 wherein the integrated circuit design comprises a design of a super scaler microprocessor having a plurality of instruction pipelines, the apparatus further comprising an interdependency microarchitecture model residing in the memory, the interdependency microarchitecture model defining a plurality of interdependencies between the plurality of instruction pipelines.

24. The program product of claim 18 further comprising a testcase definition file wherein the test coverage evaluation and adjustment mechanism causes new testcases to be automatically generated that are biased to more thoroughly test the integrated circuit design by modifying the testcase definition file.

25. An apparatus comprising:
   at least one processor:
   a memory coupled to the at least one processor;
   an integrated circuit design residing in the memory:
   a testcase generator that automatically generates a first plurality of testcases for testing the integrated circuit design according to information in a testcase definition file;
   a gate level cycle simulator residing in the memory that applies the first plurality of testcases to the integrated circuit design residing in the memory;
   a test coverage evaluation and adjustment mechanism residing in the memory and executed by the at least one processor, the test coverage evaluation and adjustment mechanism evaluating test coverage for the first plurality of testcases as applied by the gate level cycle simulator, the test coverage comprising a measure of how completely the first plurality of testcases tests the integrated circuit design, the test coverage evaluation and adjustment mechanism modifying the testcase definition file if the test coverage is inadequate to cause the testcase generator to automatically generate a second plurality of testcases that are biased to more thoroughly test the integrated circuit design, thereby causing the gate level cycle simulator to iteratively apply testcases to the integrated circuit design.

26. A method for testing an integrated circuit design residing in a memory, the method comprising the step of:
   (1) generating a first plurality of testcases for testing the integrated circuit design according to information in a testcase definition file;
   (2) applying the first plurality of testcases to the integrated circuit design;
   (3) evaluating test coverage of the testcases as applied to the integrated circuit design;
   (4) if the test coverage is inadequate, performing the steps of:
      (4A) modifying the testcase definition file;
      (4B) automatically generating a new plurality of testcases; and
      (4C) repeating steps (3) and (4) until the test coverage is adequate.

* * * * *